United States Patent [19]

Thwaites

[11] Patent Number: 5,384,021
[45] Date of Patent: Jan. 24, 1995

[54] SPUTTERING APPARATUS

[75] Inventor: Michael J. Thwaites, Basingstoke, England

[73] Assignee: The BOC Group plc, Windlesham, England

[21] Appl. No.: 104,277

[22] Filed: Aug. 10, 1993

Related U.S. Application Data

[63] Continuation of Ser. No. 955,597, Oct. 2, 1992, abandoned.

[30] Foreign Application Priority Data

Oct. 11, 1991 [GB] United Kingdom ............... 9121665

[51] Int. Cl.⁶ .............................................. C23C 14/34
[52] U.S. Cl. ........................... 204/298.21; 204/298.07; 204/298.11; 204/298.28
[58] Field of Search ................ 204/298.06, 298.07, 204/298.11, 298.21, 298.22, 298.28, 298.37

[56] References Cited

U.S. PATENT DOCUMENTS

| | | | |
|---|---|---|---|
| 4,526,643 | 7/1985 | Okano et al. | 204/298.37 X |
| 4,631,106 | 12/1986 | Nakazato et al. | 204/298.37 X |
| 4,657,619 | 4/1987 | O'Donnell | 204/298.37 X |
| 5,047,131 | 9/1991 | Wolfe et al. | 204/298.22 X |

FOREIGN PATENT DOCUMENTS

1366608 11/1972 United Kingdom.
9107521 5/1991 WIPO.

OTHER PUBLICATIONS

"Design Advances and Applications of the Rotatable Cylindrical Magnetron"; Wright and Beardow; J. Vac. Sci. Technol. A4 (3), May/Jun. 1986; pp. 388–392.

Primary Examiner—Nam Nguyen
Attorney, Agent, or Firm—David A. Draegert; Larry R. Cassett

[57] ABSTRACT

Apparatus for sputtering coatings of material onto a substrate from a chamber subject to substantial evacuation during use, which includes: a substantially cylindrical target tube having on a surface thereof the material to be sputtered, means for rotating the target tube about its longitudinal axis, magnetic means for assisting the sputtering process by the provision of a magnetic field in a sputtering zone associated with the target tube, means for moving the substrate through the chamber and into the sputtering zone, means for introducing an ionisable gas and a reactive gas into the chamber in the vicinity of the sputtering zone, wherein supplementary magnetic means are provided to form a supplementary magnetic field remote from the sputtering zone and means are provided to introduce ionisable gas in the vicinity of the supplementary magnetic field.

10 Claims, 1 Drawing Sheet

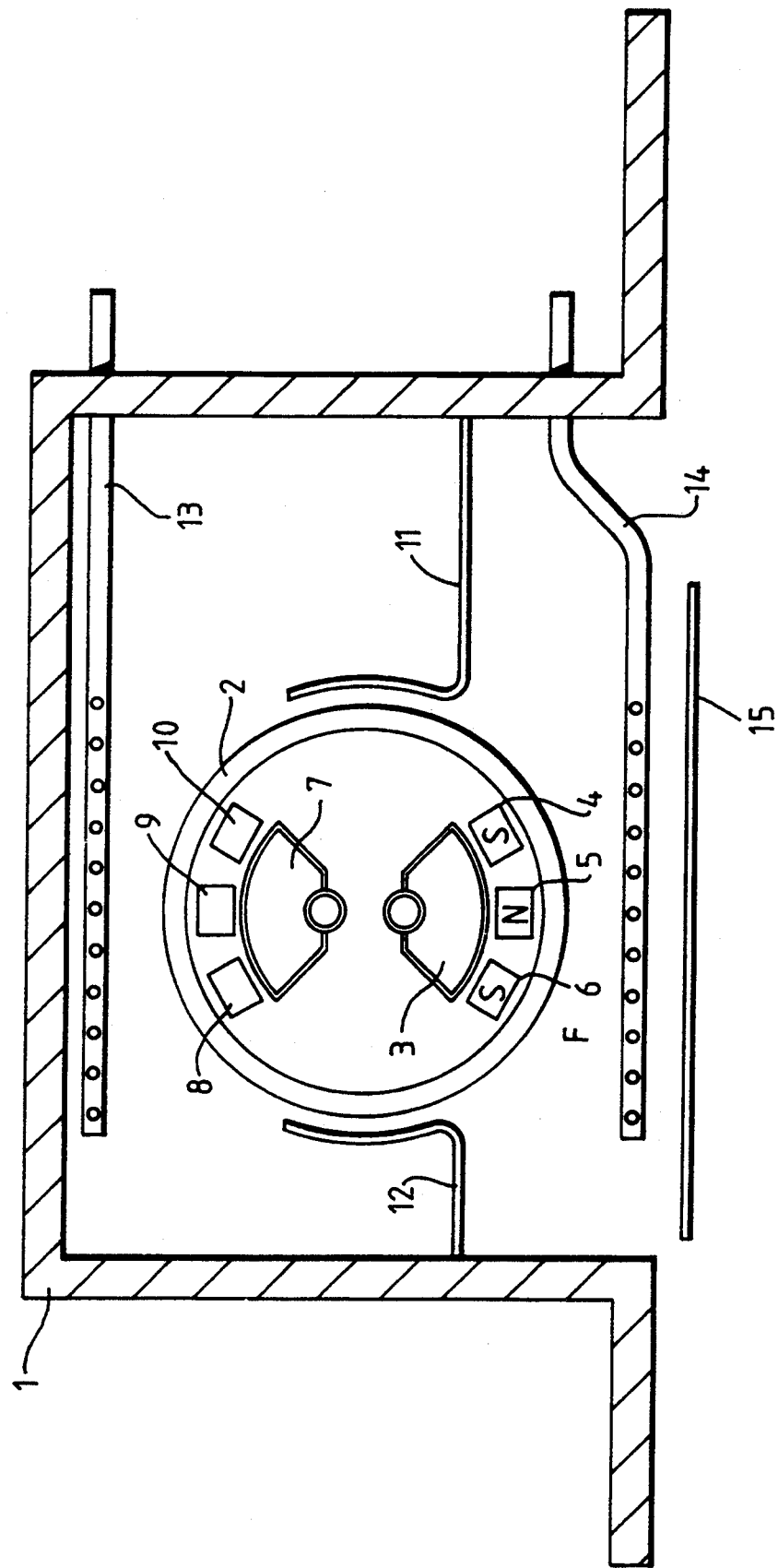

SPUTTERING APPARATUS

This is a continuation of application Ser. No. 07/955,597 filed Oct. 2, 1992.

This invention relates to processes and apparatus for sputtering thin coatings of material onto a substrate and more particularly to such processes and apparatus utilising a tubular target (cathode) of the coating material.

BACKGROUND OF THE INVENTION

Cathode sputtering processes are widely used for depositing thin coatings or films of material onto substrates. Such a process takes place in an evacuated chamber containing a small quantity of an ionisable gas, for example argon; electrons emitted from a source held within the chamber ionise the gas to form a plasma and the target comprising the material to be sputtered is bombarded by the ions causing atoms of the target material to be dislodged and subsequently deposited as a film on the substrate being coated.

It is well known that in magnetron apparatus the rate of deposition may be increased by the use of magnetic means, for example an array of permanent magnets positioned in a predetermined manner, (commonly as a closed loop), associated with the cathode target to define the area or region, often referred to as the "racetrack", from which sputtering, or erosion of the target, occurs.

The target is commonly of flat, elongate and rectangular form and the substrate being coated is moved continuously or intermittently relative to the target during the sputtering process. Apparatus having such a target and having magnetic means of the type described above is known as a planar magnetron.

One disadvantage of the conventional planar magnetron is that the race track along which the sputtering takes place is relatively small and this causes erosion of the target surface in a relatively small, for example ring-shaped, region corresponding to the shape of the closed loop magnetic field. Thus, only a small portion of the total target surface area is consumed before the target needs replacing.

It is also known, however, to replace the planar target with a hollow cylindrical one comprising, or having the outer surface thereof coated with, the material to be sputtered. Apparatus containing such a target is known as a cylindrical magnetron and is sold by Airco Coating Technology (a division of the Applicants) under the trade mark "C-Mag".

In cylindrical magnetron apparatus, the cylindrical target is rotatable about its longitudinal axis either continuously or intermittently during use so that sputtering is not confined to one particular area of the target surface. As with the planar magnetron, the substrate being coated is moved, again either continuously or intermittently, relative to the target in a direction transverse to the longitudinal axis of the target.

The magnetron means in the form of an array of permanent magnets are placed within the cylindrical target in a position closest to the substrate during coating and are generally held stationary within the cylindrical target whilst (in use) the latter rotates. However, some adjustment of the magnet array relative to the target is normally possible for overall adjustment prior to each sputtering process. Such apparatus therefore allows a much greater amount of the target to be consumed in the sputtering process by selectively bringing different portions of the target into a sputtering position in respect of the magnetic field formed by the magnets.

In reactive sputtering, a "reactive" gas is introduced into the evacuated chamber in addition to the normal ionisable gas (commonly argon). This reactive gas is present to react in situ with particles of the target material to produce a sputtered coating incorporating the reaction products. For example it is known to deposit a coating of a mixture of silicon and aluminium oxides form a silicon-aluminium alloy target by sputtering in a chamber containing argon and oxygen. Alternatively replacement of the oxygen by nitrogen as the reactive gas, can produce a coating comprising a mixture of silicon and aluminium nitrides or replacement by a hydrocarbon can produce a coating comprising a mixture of carbides.

However, in such sputtering systems, there can be a tendency for the reactive gas to react with the target material prior to the individual target material particles being sputtered from the target, thereby forming a layer in the target of oxide, nitride or carbide (or whatever). The formation of such layer on the target is clearly undesirable as it affects sputtering performance.

It is common practice for the ionisable gas and the reactive gas to be introduced into the evacuated chamber through individual inlets or through a common inlet. The present invention is concerned with controlling the introduction of these gases such that the problems associated with the formation of undesirable target layers is obviated or at least minimised.

SUMMARY OF THE INVENTION

In accordance with the invention, there is provided apparatus for sputtering coatings of material onto a substrate from a chamber subject to substantial evacuation during use, which includes:

a substantially cylindrical target tube having on a surface thereof the material to be sputtered means for rotating the target tube about its longitudinal axis magnetic means for assisting the sputtering process by the provision of a magnetic field in a sputtering zone associated with the target tube means for moving the substrate through the chamber and into the sputtering zone means for introducing an ionisable gas and a reactive gas into the chamber in the vicinity of the sputtering zone wherein supplementary magnetic means are provided to form a supplementary magnetic field remote from the sputtering zone and means are provided to introduce ionisable gas in the vicinity of the supplementary magnetic field.

It is generally preferred that reactive gas is not introduced into the chamber in the vicinity of the supplementary magnetic field. This allows a supplementary sputtering process to occur in the supplementary magnetic field in the absence of such reactive gas. As such the supplementary process, by allowing the ionisable gas to be ionised by the electron stream present in the chamber and by allowing the ionised gas to bombard the surface of the target tube, acts to remove through such bombardment the film of reactive gas reaction products from the surface of the target tube.

In preferred embodiments, the primary magnetic means for providing the field for the sputtering zone and the supplementary magnetic means each comprise elongate arrays of magnets extending substantially the length of the tube, being substantially parallel to the longitudinal axis of the target tube and being positioned close to the internal surface of the target tube at diametrically opposed sides of the tube. The tube must be designed for rotation about its longitudinal axis relative to the two magnetic arrays which will remain stationary.

Preferably, the ionisable gas and the reactive gas are introduced into the sputtering zone associated with the primary magnetic array and on the outside of the tube by means of a pipe (or whatever) penetrating the sputtering zone; the pipe can be advantageously perforated along its length within the sputtering zone. The gases may be introduced separately or pre-mixed.

The ionisable gas alone, i.e. with no reactive gas, is preferably introduced into the chamber in the vicinity of the supplementary magnetic filed by a similar pipe, again preferably perforated.

In this way and during use of the apparatus of the invention, the primary magnetic means are present to concentrate the deposition of sputtered material on to a substrate positioned close to the target tube and in particular to the sputtering zone in which the reactive gas is delivered on a continual basis.

By delivering only the ionisable gas (and no reactive gas) to the supplementary magnetic field area on the opposite side of the target tube, there will be supplementary sputtering taking place of material in that part of the tube and, in the absence of substantial amounts of reactive gas, this supplementary sputtering should remove any unwanted "reaction" film formed on the surface of the target tube during the reactive deposition phase.

Although not essential, baffles may be used in the chamber to assist in the retention of the reactive gas in the sputtering zone only and prevent substantial quantities migrating to the supplementary magnetic field area.

For a better understanding of the invention, reference will now be made, by way of exemplification only, to the accompanying drawing which show a schematic sectional view of an apparatus of the invention.

BRIEF DESCRIPTION OF THE DRAWING

The drawing is a schematic diagram, partially in cross section, of a sputter coating apparatus according to the present invention.

DESCRIPTION OF THE PREFERRED EMBODIMENTS

With reference to the drawing, there is shown an apparatus of the invention having a chamber with a wall 1 within which is situated a target tube 2 mounted for rotation about its longitudinal axis by means not shown.

Positioned within the target tube 2 (and held stationary therein) is a primary magnet array 3 having mounted thereon three elongate permanent magnets 4, 5 and 6 of alternate polarity. The magnets 4, 5 and 6 are of substantially the same length as the tube 2 and arranged to be parallel to the longitudinal axis of the tube 2.

Also positioned within the target tube 2 (and held stationary therein) is a supplementary magnet array 7 having mounted thereon three elongate permanent magnets 8, 9, 10, each of which are of substantially the same length as the tube 2 and arranged to be parallel to the longitudinal axis of the tube 2.

Positioned externally of the tube 2 is a pair of baffles 11, 12 which extend the length of the chamber and are designed to divide the chamber into upper and lower portions.

A perforated pipe 13 is designed to deliver an ionisable gas into the upper chamber portion. A perforated pipe 14 is designed to deliver a mixture of an ionisable gas and a reactive gas into the lower chamber portion.

A substrate 15 to be coated by sputtering from the target tube 2 is shown which, in use of the apparatus, moves in a direction at right angles to the longitudinal axis of the tube 2, i.e. from left to right (or vice-versa) as shown in the drawing.

The apparatus can therefore define, in use, a sputtering zone in the lower portion of the chamber between the external surface of the tube 2 and the substrate 15 and a supplementary magnetic field (remote from the sputtering zone) associated with the supplementary magnetic array 7.

In use of the apparatus, reactive gas (plus ionisable gas) is introduced only via the pipe 14 into the sputtering zone in the lower chamber portion with the baffles 11, 12 tending to Keep the reaction gas in particular in that zone. Sputtering onto the substrate 15 therefore proceeds in the normal way. However, as stated above, the reactive gas may react with the target material and form a layer of oxide, carbide and nitride on the surface of the tube 2 which may detract from the sputtering performance.

However, on each revolution of the target tube 2, the supplementary sputtering in the upper chamber portion (in the absence of reaction gas) tends to remove the deleterious layer from the tube surface by bombardment of ionised gas particles.

In this way, the surface of the target tube 2 is cleared on each revolution.

I claim:

1. Apparatus for sputtering coatings of material onto a substrate from a chamber subject to evacuation during use, which comprises:
    a substantially cylindrical target tube having on a surface thereof the material to be sputtered;
    means for rotating the target tube about its longitudinal axis;
    primary magnetic means for assisting the sputtering process by the provision of a magnetic field in a sputtering zone associated with the target tube;
    means for moving the substrate through the chamber and into the sputtering zone;
    means for introducing an ionisable gas and a reactive gas into the chamber in the vicinity of the sputtering zone;
wherein supplementary magnetic means are provided to form a supplementary magnetic field remote from the sputtering zone and means are provided to introduce ionisable gas in the vicinity of the supplementary magnetic field.

2. Apparatus according to claim 1 in which the reactive gas is introduced into the chamber other than in the vicinity of the supplementary magnetic field.

3. Apparatus according to claim 2 in which the primary magnetic means for providing the field for the sputtering zone and the supplementary magnetic means each comprise elongated arrays of magnets extending substantially the length of the tube, being substantially parallel to the longitudinal axis of the target tube and being positioned close to the internal surface of the target tube at diametrically opposed sides of the tube.

4. Apparatus according to claim 3 in which baffles are present in the chamber to assist retention of the reactive gas in the sputtering zone and to prevent substantial quantities migrating to the supplementary magnetic field area.

5. Apparatus according to claim 1 in which the primary magnetic means for providing the field for the sputtering zone and the supplementary magnetic means each comprise elongated arrays of magnets extending substantially the length of the tube, being substantially parallel to the longitudinal axis of the target tube and being positioned close to the internal surface of the target tube at diametrically opposed sides of the tube.

6. Apparatus according to claim 1 in which the ionisable gas and the reactive gas are introduced into the sputtering zone associated with the primary magnetic means and on the outside of the tube by gas introduction means penetrating the sputtering zone.

7. Apparatus according to claim 6 in which the gas introduction means is a pipe perforated along its length within the sputtering zone.

8. Apparatus according to claim 7 in which the ionisable gas alone is introduced into the chamber in the vicinity of the supplementary magnetic field by means of a perforated pipe.

9. Apparatus according to claim 8 in which baffles are present in the chamber to assist retention of the reactive gas in the sputtering zone and to prevent substantial quantities migrating to the supplementary magnetic field area.

10. Apparatus according to claim 1 in which baffles are present in the chamber to assist retention of the reactive gas in the sputtering zone and to prevent substantial quantities migrating to the vicinity of the supplementary magnetic means.

* * * * *